(12) United States Patent
Chen et al.

(10) Patent No.: US 12,369,276 B2
(45) Date of Patent: Jul. 22, 2025

(54) STORAGE ASSEMBLY AND HEAT DISSIPATION DEVICE

(71) Applicant: COOLER MASTER CO., LTD., Taipei (TW)

(72) Inventors: Bo-Zhang Chen, Taipei (TW); Jen-Chih Cheng, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 224 days.

(21) Appl. No.: 18/207,653

(22) Filed: Jun. 8, 2023

(65) Prior Publication Data

US 2024/0373590 A1    Nov. 7, 2024

(30) Foreign Application Priority Data

May 3, 2023  (TW) ................. 112204211

(51) Int. Cl.
*H05K 7/20*    (2006.01)

(52) U.S. Cl.
CPC ....... *H05K 7/20336* (2013.01); *H05K 7/2039* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,278,470 B2* | 10/2007 | Xia | ................. | H01L 23/3672 |
| | | | | 165/104.21 |
| 7,295,437 B2* | 11/2007 | Lee | ................. | H01L 23/467 |
| | | | | 361/698 |
| 7,597,134 B2* | 10/2009 | Min | ................. | H01L 23/4006 |
| | | | | 165/104.33 |
| 7,753,110 B2* | 7/2010 | Yang | ................. | F28D 15/0275 |
| | | | | 165/104.33 |
| 7,866,376 B2* | 1/2011 | Jiang | ................. | H01L 23/467 |
| | | | | 165/104.33 |
| 9,668,377 B2* | 5/2017 | Lim | ................. | H05K 1/0203 |
| 11,147,185 B2* | 10/2021 | Sugawara | ................. | H05K 7/20154 |
| 11,758,688 B2* | 9/2023 | Li | ................. | G06F 1/20 |
| | | | | 165/80.4 |
| 12,123,652 B2* | 10/2024 | Wu | ................. | H05K 7/20772 |
| 2007/0114009 A1* | 5/2007 | Xia | ................. | F28D 15/0275 |
| | | | | 257/E23.103 |
| 2008/0017351 A1* | 1/2008 | Zhou | ................. | H01L 23/467 |
| | | | | 257/E23.099 |
| 2013/0025830 A1* | 1/2013 | Lin | ................. | F28F 1/32 |
| | | | | 165/104.26 |
| 2018/0042136 A1* | 2/2018 | Sugawara | ................. | H01L 23/427 |
| 2019/0293361 A1* | 9/2019 | Bosak | ................. | H05K 7/20809 |
| 2020/0355443 A1* | 11/2020 | Tochigi | ................. | F28D 15/0275 |
| 2022/0030746 A1* | 1/2022 | Shih | ................. | H05K 7/20272 |
| 2022/0295668 A1* | 9/2022 | Namboori | ................. | H05K 7/20336 |
| 2024/0373590 A1* | 11/2024 | Chen | ................. | H05K 7/20336 |

\* cited by examiner

*Primary Examiner* — Lisa Lea-Edmonds
(74) *Attorney, Agent, or Firm* — Maschoff Brennan

(57) ABSTRACT

A storage assembly includes a heat dissipation device and a storage. The heat dissipation device includes a thermally conductive block, a heat sink and a plurality of heat pipes. An end of each of the heat pipes is thermally coupled with the thermally conductive block, and another end of each of the heat pipes is thermally coupled with the heat sink. The storage is thermally coupled with the thermally conductive block.

7 Claims, 4 Drawing Sheets

US 12,369,276 B2

STORAGE ASSEMBLY AND HEAT DISSIPATION DEVICE

CROSS-REFERENCE TO RELATED APPLICATIONS

This non-provisional application claims priority under 35 U.S.C. § 119 (a) on Patent Application No(s). 112204211 filed in Taiwan, R.O.C. on May 3, 2023, the entire contents of which are hereby incorporated by reference.

TECHNICAL FIELD

The disclosure relates to a storage assembly and a heat dissipation device, more particularly to a storage assembly and a heat dissipation device having heat pipes.

BACKGROUND

As solid state drives (i.e., SSDs) progresses, writing and reading speed of the SSDs are faster. High writing and reading speed of the SSD may result in the increasing of the temperature of the SSD, and thus a heat dissipation device is generally used to dissipate heat generated by the SSD.

A conventional heat dissipation device mainly includes a base and fins. The fins are generally made of aluminum. Heat generated by the SSD can be conducted to the aluminum fins, and then the aluminum fins can perform heat exchange with air for dissipating heat. However, the heat conduction speed of the aluminum fins is unable to meet the requirements of long-term games or videos. Furthermore, an internal space of a computer is limited due to the compact arrangement of electronic components or assemblies of the computer, and thus it is difficult to install a larger heat dissipation device.

SUMMARY

The disclosure provides a storage assembly and a heat dissipation device which are capable of enhancing the heat dissipation efficiency of the storage assembly and the heat dissipation device in the limited space.

One embodiment of the disclosure provides a storage assembly. The storage assembly includes a heat dissipation device and a storage. The heat dissipation device includes a thermally conductive block, a heat sink and a plurality of heat pipes. An end of each of the heat pipes is thermally coupled with the thermally conductive block, and another end of each of the heat pipes is thermally coupled with the heat sink. The storage is thermally coupled with the thermally conductive block.

Another embodiment of the disclosure provides a heat dissipation device. The heat dissipation device is adapted to be thermally coupled with a storage. The heat dissipation device includes a thermally conductive block, a heat sink and a plurality of heat pipes. The thermally conductive block is configured to be thermally coupled with the storage. One end of each of the heat pipes is thermally coupled with the thermally conductive block, and another end of each of the heat pipes is thermally coupled with the heat sink.

According to the storage assembly and the heat dissipation device as discussed in the above embodiment, a space where the storage is located is limited, and thus it is difficult to increase the volume and the area of the heat sink for achieving desired heat dissipation requirement of the storage. In the disclosure, more heat pipes are provided to thermally couple the thermally conductive block with the fins so as to enhance the heat dissipation efficiency of the storage assembly and the heat dissipation device in the limited space.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
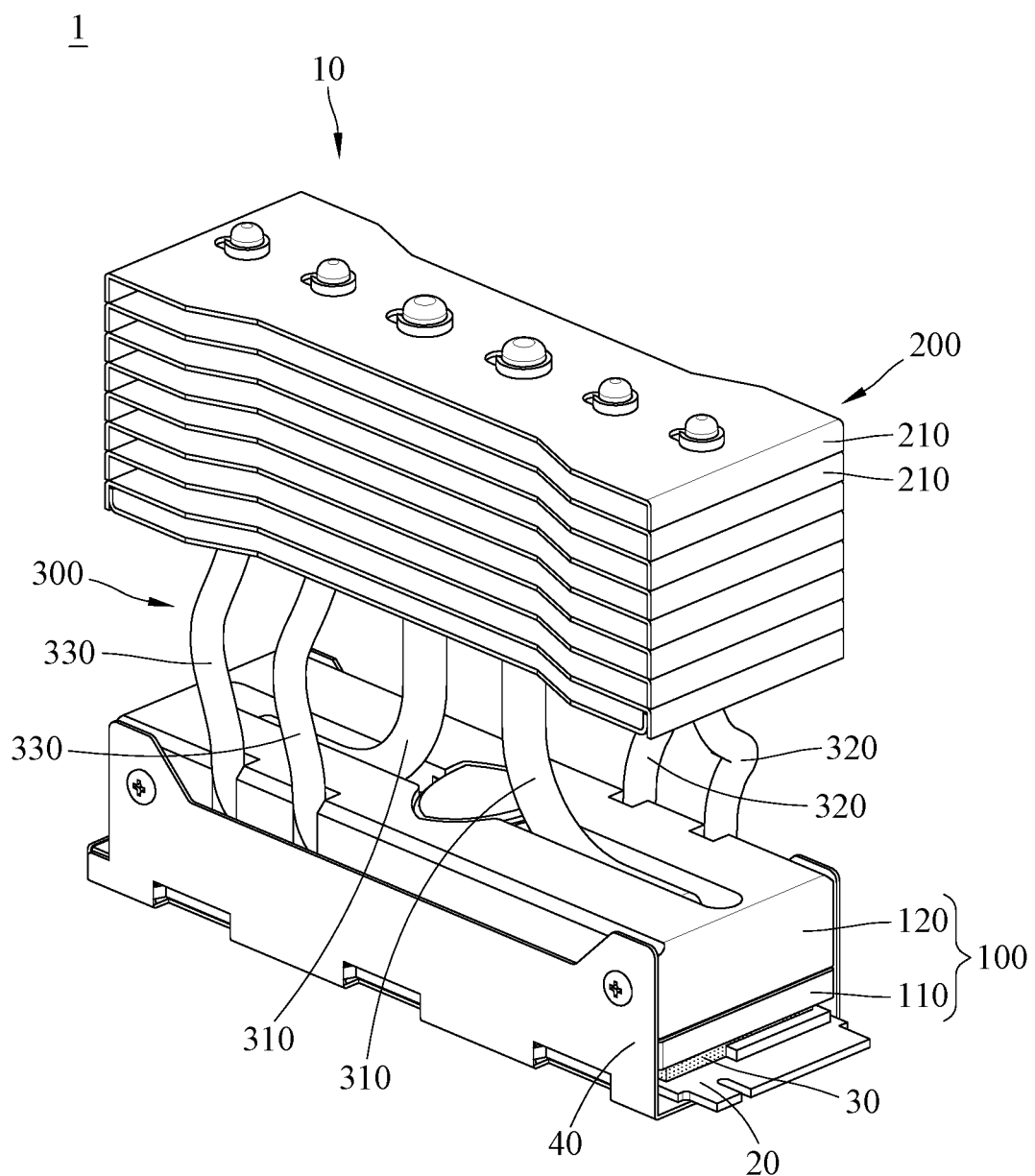
FIG. 1 is a perspective view of a storage assembly according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
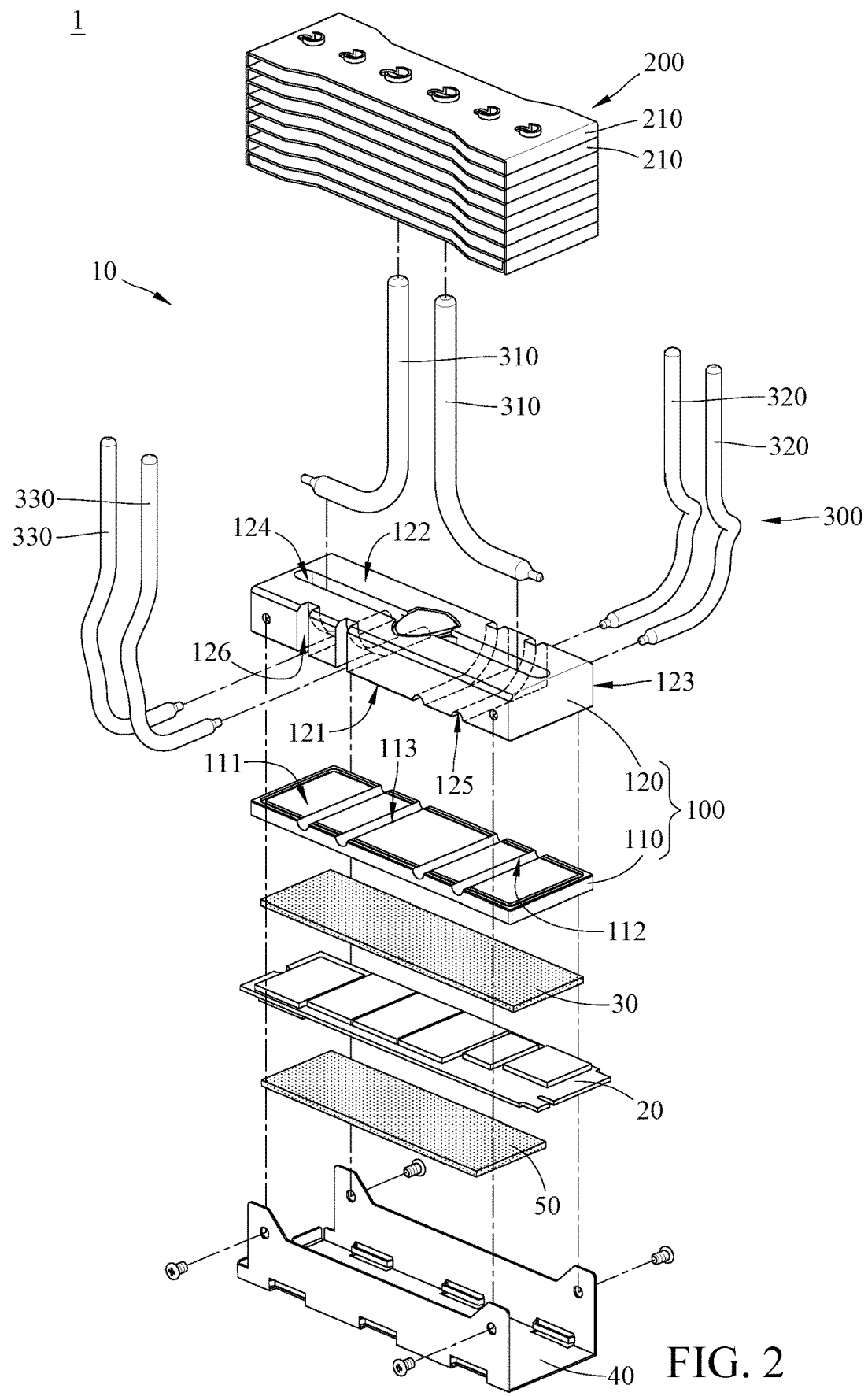
FIG. 2 is an exploded view of the storage assembly in FIG. 1.
Figure 3:
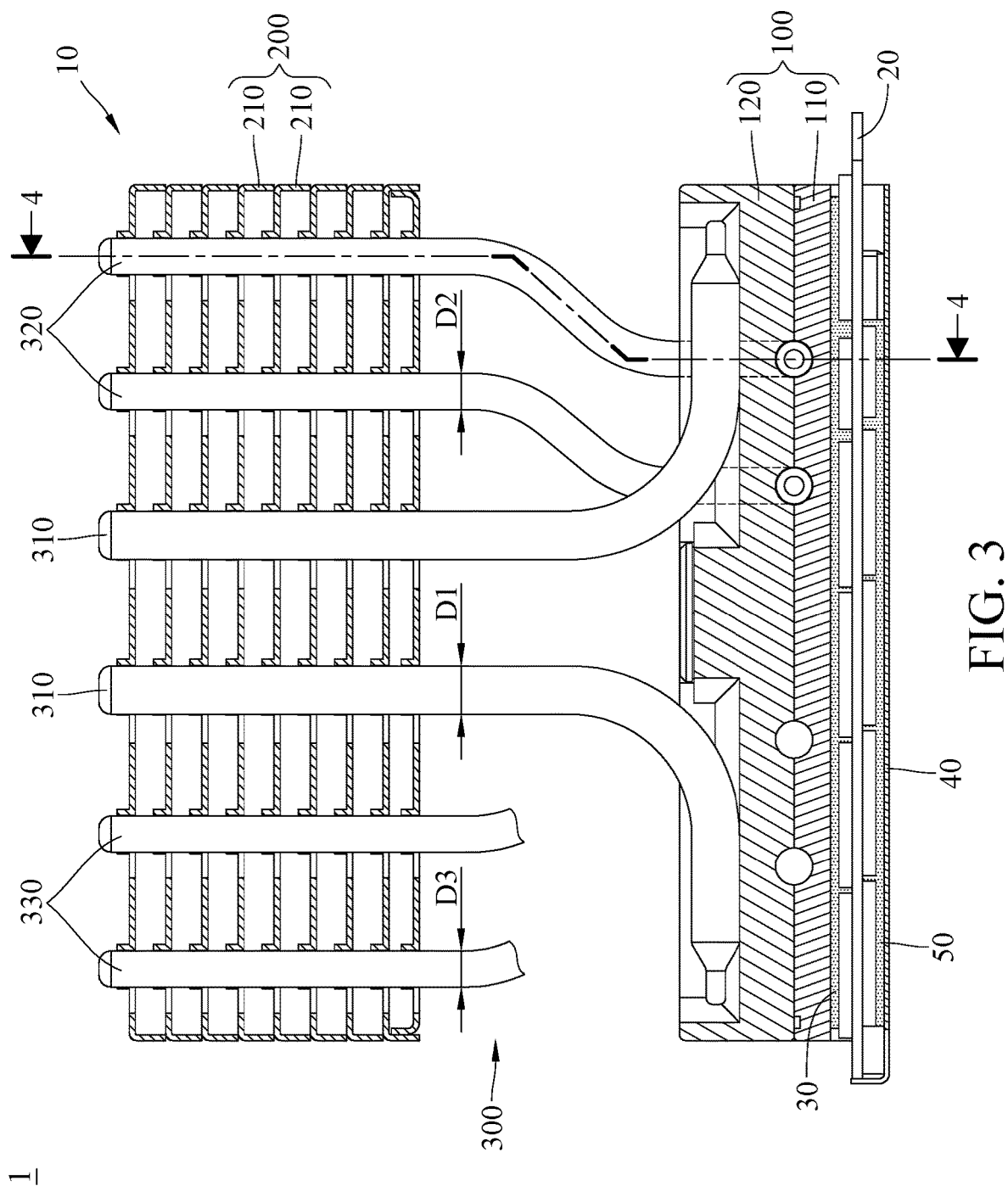
FIG. 3 is a cross-sectional view of the storage assembly in FIG. 1.
Figure 4:
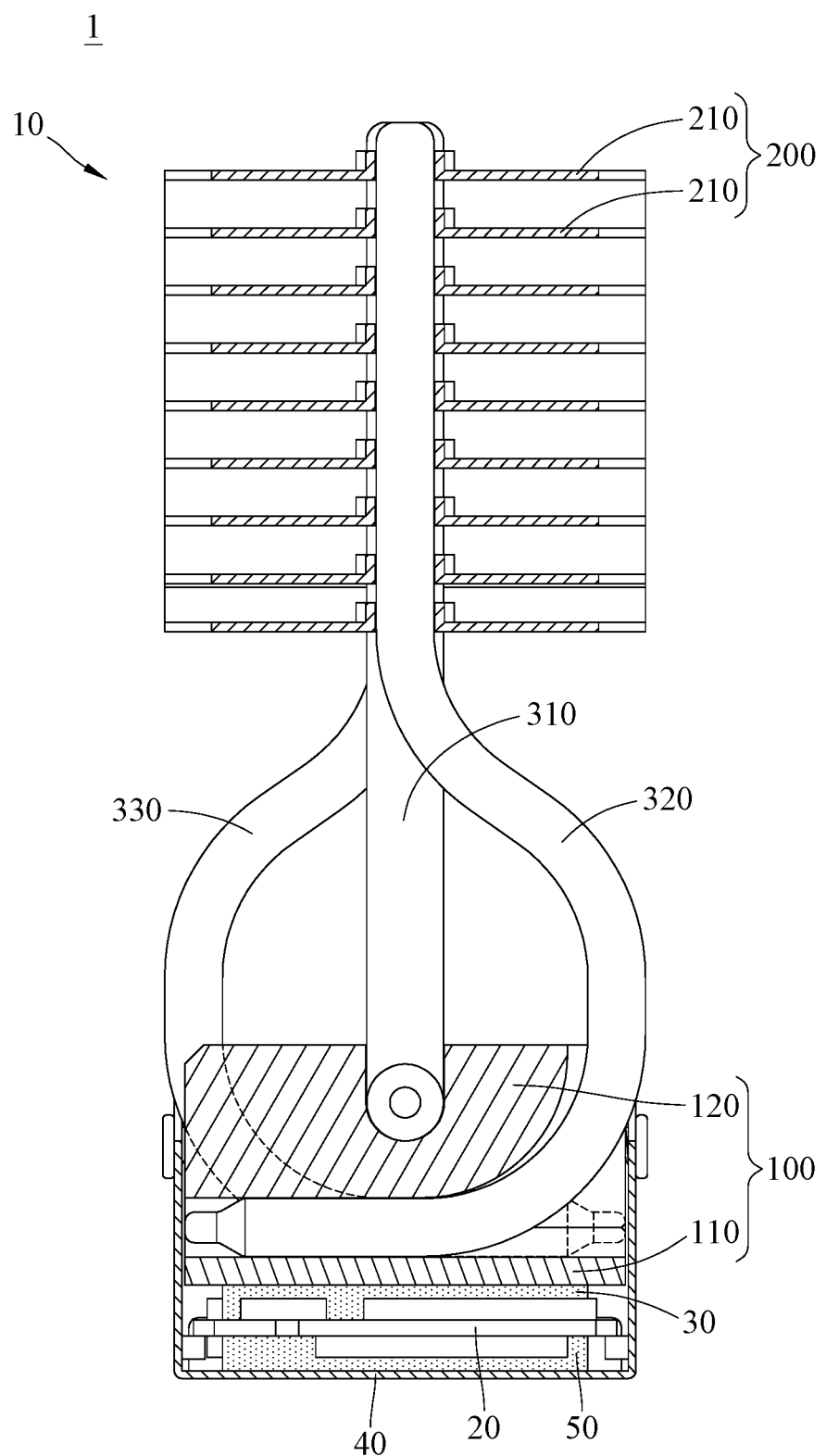
FIG. 4 is a cross-sectional view of the storage assembly taken along a line 4-4 in FIG. 3.

Referring to FIGS. 1 to 4, FIG. 1 is a perspective view of a storage assembly 1 according to one embodiment of the disclosure, FIG. 2 is an exploded view of the storage assembly 1 in FIG. 1, FIG. 3 is a cross-sectional view of the storage assembly 1 in FIG. 1, and FIG. 4 is a cross-sectional view of the storage assembly 1 taken along a line 4-4 in FIG. 3.

In this embodiment, the storage assembly 1 includes a heat dissipation device 10 and a storage 20. In addition, the storage assembly 1 may further include a cage 40, a first thermally conductive adhesive 30 and a second thermally conductive adhesive 50.

The heat dissipation device 10 includes a thermally conductive block 100, a heat sink 200 and a plurality of heat pipes 300. The thermally conductive block 100 is, for example, made of metal material, such as gold, silver, copper or aluminum. The thermally conductive block 100 includes a lower conductive part 110 and an upper conductive part 120. The upper conductive part 120 is removably mounted on the lower conductive part 110. The lower conductive part 110 has a surface 111, two first lower recesses 112 and two second lower recesses 113. The first lower recesses 112 and the second lower recesses 113 are located at the surface 111. The upper conductive part 120 has a first surface 121, a second surface 122, a third surface 123, two accommodation recesses 124, two first upper recesses 125 and two second upper recesses 126. The first surface 121 faces the surface 111, the second surface 122 faces away from the first surface 121. The third surface 123 is located between the first surface 121 and the second surface 122. The two accommodation recesses 124 are located at the second surface 122. The two first upper recesses 125 and the two second upper recesses 126 are, for example, in a curved shape and extend from the first surface 121 to the third surface 123.

The heat sink 200 includes a plurality of fins 210, and the fins 210 are arranged side by side.

One end of each of the heat pipes 300 is thermally coupled with the thermally conductive block 100, and another end of each of the heat pipes 300 is thermally coupled with the fins 210 of the heat sink 200. The heat pipes 300 includes two first heat pipes 310, two second heat pipes 320 and two third heat pipes 330. One end of each of the first heat pipes 310 is disposed on the upper conductive part 120. One end of each of the second heat pipes 320 and one end of each of the third heat pipes 330 are disposed between the lower conductive part 110 and the upper conductive part 120. Specifically, ends of the first heat pipes 310 are respectively located in the accommodation recesses 124. Ends of the second heat pipes 320 are respectively located in the first upper recesses 125 and the first lower recesses 112. Ends of the third heat pipes 330 are respectively located in the second upper recesses 126 and the second lower recesses 113. As a result, the first heat pipes 310, the second heat pipes 320 and the third heat pipes 330 are in a stacked and orthogonal arrangement; that is, at least part of the second heat pipes 320 and at least part of the third heat pipes 330 are perpendicular to the first heat pipes 310 and surround the first heat pipes 310.

In this embodiment, pipe diameters D1 of the first heat pipes 310 are larger than pipe diameters D2 of the second heat pipes 320 and pipe diameters D3 of the third heat pipes 330.

In general, a space where the storage 20 is located is limited, and thus it is difficult to increase the volume and the area of the heat sink 200 for achieving desired heat dissipation requirement of the storage 20. In this embodiment, more heat pipes 300 are provided to thermally couple the thermally conductive block 100 with the fins 210 so as to enhance the heat dissipation efficiency of the storage assembly 1 and the heat dissipation device 10 in the limited space.

In addition, the width of the storage 20 is small, and thus if more heat pipes were in the stacked and parallel arrangement, the heat pipes in the lower layer are required to be bent with larger curvature to dodge the heat pipes in the upper layer, which increases the overall length of the heat dissipation device and may cause the heat dissipation device to interfere with components therearound. Therefore, in this embodiment, the heat pipes 300 are in the stacked and orthogonal arrangement, such that more heat pipes 300 can be provided while the width of the storage 20 is small.

The storage 20 is, for example, a M.2 solid state drive. The storage 20 is thermally coupled with the lower conductive part 110 of the thermally conductive block 100. Specifically, the cage 40 is, for example, made of a thermally conductive material and mounted to the lower conductive part 110 of the thermally conductive block 100 via screws. The cage 40 supports the storage 20 so as to thermally couple the storage 20 with the thermally conductive block 100. The first thermally conductive adhesive 30 is clamped between the lower conductive part 110 of the thermally conductive block 100 and the storage 20. The second thermally conductive adhesive 50 is clamped between the storage 20 and the cage 40. As a result, heat generated by the storage 20 can be rapidly conducted to the thermally conductive block 100 and the cage 40.

In this embodiment, the storage 20 is thermally coupled to the thermally conductive block 100 or the cage 40 via the thermally conductive adhesive, but the disclosure is not limited thereto; in some other embodiments, the storage may be directly in thermal contact with the thermally conductive block or the cage. On the other hand, in this embodiment, the storage 20 is supported by the cage 40 and mounted to the thermally conductive block 100 via the cage 40, but the disclosure is not limited thereto; in some other embodiments, the storage may be directly mounted to the thermally conductive block.

According to the storage assembly and the heat dissipation device as discussed in the above embodiment, a space where the storage is located is limited, and thus it is difficult to increase the volume and the area of the heat sink for achieving desired heat dissipation requirement of the storage. In the disclosure, more heat pipes are provided to thermally couple the thermally conductive block with the fins so as to enhance the heat dissipation efficiency of the storage assembly and the heat dissipation device in the limited space.

In addition, the width of the storage is small, and thus if more heat pipes were in the stacked and parallel arrangement, the heat pipes in the lower layer are required to be bent with larger curvature to dodge the heat pipes in the upper layer, which increases the overall length of the heat dissipation device and may cause the heat dissipation device to interfere with components therearound. Therefore, in the disclosure, the heat pipes are in the stacked and orthogonal arrangement, such that more heat pipes can be provided while the width of the storage is small.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A storage assembly, comprising:
   a heat dissipation device, comprising:
      a thermally conductive block;
      a heat sink; and
      a plurality of heat pipes, wherein an end of each of the plurality of heat pipes is thermally coupled with the thermally conductive block, and another end of each of the plurality of heat pipes is thermally coupled with the heat sink; and
   a storage, thermally coupled with the thermally conductive block;
   wherein the heat dissipation device further comprises a cage, the cage is mounted to the thermally conductive block and supports the storage so as to thermally couple the storage with the thermally conductive block.

2. The storage assembly according to claim 1, wherein the plurality of heat pipes comprises at least one first heat pipe and at least one second heat pipe, and a pipe diameter of the at least one first heat pipe is larger than a pipe diameter of the at least one second heat pipe.

3. The storage assembly according to claim 2, wherein the plurality of heat pipes further comprises at least one third heat pipe, and the pipe diameter of the at least one first heat pipe is larger than a pipe diameter of the at least one third heat pipe.

4. The storage assembly according to claim 3, wherein the thermally conductive block comprises a lower conductive part and an upper conductive part, the upper conductive part is removably mounted on the lower conductive part, one end of the at least one first heat pipe is disposed on the upper conductive part, and one end of the at least one second heat pipe and one end of the at least one third heat pipe are disposed between the lower conductive part and the upper conductive part.

5. The storage assembly according to claim 4, wherein the lower conductive part has a surface, a first lower recess and a second lower recess, the first lower recess and the second lower recess are located at the surface of the lower conductive part, the upper conductive part has a first surface, a second surface, a third surface, at least one accommodation recess, at least one first upper recess and at least one second upper recess, the first surface faces the surface of the lower conductive part, the second surface faces away from the first surface, the third surface is located between the first surface and the second surface, the at least one accommodation recess is located at the second surface, the at least one first upper recess and the at least one second upper recess are in a curved shape and extend from the first surface to the third surface, one end of the at least one first heat pipe is located in the at least one accommodation recess, one end of the at least one second heat pipe is located in the at least one first upper recess and the at least one first lower recess, and one end of the at least third heat pipe is located in the at least one second upper recess and the at least one second lower recess.

6. The storage assembly according to claim 1, further comprising a first thermally conductive adhesive and a second thermally conductive adhesive, wherein the first thermally conductive adhesive is clamped between the thermally conductive block and the storage, and the second thermally conductive adhesive is clamped between the storage and the cage.

7. A heat dissipation device, adapted to be thermally coupled with a storage, the heat dissipation device comprising:
- a thermally conductive block, configured to be thermally coupled with the storage;
- a heat sink; and
- a plurality of heat pipes, wherein one end of each of the plurality of heat pipes is thermally coupled with the thermally conductive block, and another end of each of the plurality of heat pipes is thermally coupled with the heat sink;

wherein the plurality of heat pipes comprises at least one first heat pipe and at least one second heat pipe, and a pipe diameter of the at least one first heat pipe is larger than a pipe diameter of the at least one second heat pipe;

wherein the plurality of heat pipes further comprises at least one third heat pipe, and the pipe diameter of the at least one first heat pipe is larger than a pipe diameter of the at least one third heat pipe;

wherein the thermally conductive block comprises a lower conductive part and an upper conductive part, the upper conductive part is removably mounted on the lower conductive part, one end of the at least one first heat pipe is disposed on the upper conductive part, and one end of the at least one second heat pipe and one end of the at least one third heat pipe are disposed between the lower conductive part and the upper conductive part;

wherein the lower conductive part has a surface, a first lower recess and a second lower recess, the first lower recess and the second lower recess are located at the surface of the lower conductive part, the upper conductive part has a first surface, a second surface, a third surface, at least one accommodation recess, at least one first upper recess and at least one second upper recess, the first surface faces the surface of the lower conductive part, the second surface faces away from the first surface, the third surface is located between the first surface and the second surface, the at least one accommodation recess is located at the second surface, the at least one first upper recess and the at least one second upper recess are in a curved shape and extend from the first surface to the third surface, one end of the at least one first heat pipe is located in the at least one accommodation recess, one end of the at least one second heat pipe is located in the at least one first upper recess and the at least one first lower recess, and one end of the at least third heat pipe is located in the at least one second upper recess and the at least one second lower recess.

* * * * *